(12) United States Patent
Kim et al.

(10) Patent No.: US 10,693,099 B2
(45) Date of Patent: Jun. 23, 2020

(54) ELECTROLUMINESCENT DISPLAY DEVICE HAVING A CHARGE GENERATING LAYER BETWEEN A PLURALITY OF LIGHT EMITTING LAYERS

(71) Applicant: LG DISPLAY CO., LTD., Seoul (KR)

(72) Inventors: Hojin Kim, Paju-si (KR); Goeun Jung, Paju-si (KR); Seungmin Baik, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/178,743

(22) Filed: Nov. 2, 2018

(65) Prior Publication Data

US 2019/0181368 A1 Jun. 13, 2019

(30) Foreign Application Priority Data

Nov. 3, 2017 (KR) .................. 10-2017-0145880

(51) Int. Cl.
| | |
|---|---|
| *H01L 29/08* | (2006.01) |
| *H01L 33/00* | (2010.01) |
| *H01L 31/0232* | (2014.01) |
| *H01L 21/00* | (2006.01) |
| *H01L 51/40* | (2006.01) |
| *H01L 51/50* | (2006.01) |
| *H01L 51/52* | (2006.01) |
| *H01L 27/32* | (2006.01) |

(52) U.S. Cl.
CPC .......... *H01L 51/504* (2013.01); *H01L 27/322* (2013.01); *H01L 27/3209* (2013.01); *H01L 27/3211* (2013.01); *H01L 27/3258* (2013.01); *H01L 27/3262* (2013.01); *H01L 51/5036* (2013.01); *H01L 51/5203* (2013.01); *H01L 51/5278* (2013.01)

(58) Field of Classification Search
CPC ............... H01L 51/504; H01L 27/3209; H01L 27/3211; H01L 27/322; H01L 27/3262; H01L 51/5278; H01L 51/5203
See application file for complete search history.

(56) References Cited

U.S. PATENT DOCUMENTS 10,340,315 B2 * 7/2019 Shim .................. H01L 51/5088
2018/0122870 A1 * 5/2018 Park .................... H01L 51/5044

FOREIGN PATENT DOCUMENTS

| KR | 20150025727 A | 3/2015 |
| KR | 20170051614 A | 5/2017 |
| KR | 20170064164 A | 6/2017 |

* cited by examiner

*Primary Examiner* — Alonzo Chambliss
(74) *Attorney, Agent, or Firm* — Polsinelli PC

(57) ABSTRACT

The present disclosure provides an electroluminescent display device comprising a lower substrate, an insulating layer and subpixels. The insulating layer is positioned on the lower substrate subpixels. The subpixels are positioned on the insulating layer and include light emitting diodes comprising at least two light emitting layers emitting different colors. The subpixels includes a first subpixel in which only one light emitting layer of the at least two light emitting layers emits light and a second subpixel in which both of two light emitting layers of the at least two light emitting layers emit light.

13 Claims, 13 Drawing Sheets

SPG ≒ SPR < SPB

SPG ≒ SPR ≒ SPB

| Stack structure | | Effect | Remarks |
|---|---|---|---|
| Fourth Embodiment | YG / Blue | Blue CF Deleted | |
| First Modification | Magenta / Green | Green CF Deleted | In Using R, G, B CF |
| Second Modification | Cyan / Red | Red CF Deleted | |
| Third Modification | Blue / YG | Y CF Deleted | |
| Fourth Modification | Yellow / Magenta | M CF Deleted | In Using C, M, Y CF |
| Fifth Modification | Red / Cyan | C CF Deleted | |

# ELECTROLUMINESCENT DISPLAY DEVICE HAVING A CHARGE GENERATING LAYER BETWEEN A PLURALITY OF LIGHT EMITTING LAYERS

CROSS REFERENCE TO RELATED APPLICATION

This application claims the benefit of Korean Patent Application No. 10-2017-0145880, filed on Nov. 3, 2017, which is incorporated herein by reference in its entirety for all purposes as if fully set forth herein.

BACKGROUND

Field of the Disclosure

The present disclosure relates to an electroluminescent display device.

Description of the Background

With the development of information technology, the market for displays that play an intermediary role between users and information is growing. Thus, display devices such as electroluminescent display devices, liquid crystal displays (LCDs), and plasma display panels (PDPs) are increasingly used.

A display device comprises a display panel including a plurality of subpixels, a driver for driving the display panel, a power supply unit for supplying power to the display panel, and so on. The driver comprises a scan driver for supplying scan signals or gate signals to the display panel and a data driver for supplying data signals to the display panel.

If the scan signals and the data signals are supplied to the subpixels, then light emitting diodes in selected subpixels emit light such that an electroluminescent display device displays image. The light emitting didoes are implemented on an organic basis or on an inorganic basis.

Since the electroluminescent display device displays image based on the light emitted by the light emitting diodes included in the subpixels, it has various advantages as a next generation display device regardless of its size, such as small size, medium size and large size. Conventional electroluminescent display devices still need room for improvement in application to various types of display devices so need to be studied.

SUMMARY

The present disclosure provides an electroluminescent display device comprising a lower substrate, an insulating layer and subpixels. The insulating layer is positioned on the lower substrate subpixels. The subpixels are positioned on the insulating layer and include light emitting diodes comprising at least two light emitting layers emitting different colors. The subpixels includes a first subpixel in which only one light emitting layer of the at least two light emitting layers emits light and a second subpixel in which both of two light emitting layers of the at least two light emitting layers emit light.

The present disclosure according to another aspect provides an electroluminescent display device comprising a display panel and a driver. The display panel includes subpixels comprising a two stack white light emitting diode having two light emitting layers which emit light of different colors and a color filter layer converting the light emitted from the two stack white light emitting diode. The driver drives the display panel. The display panel includes a first subpixel in which only one light emitting layer of the two light emitting layers emits light and a second subpixel in which both of the two light emitting layers emit light.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure. In the drawings.

DETAILED DESCRIPTION OF THE ILLUSTRATED ASPECTS

Hereinafter, specific aspects according to the present disclosure will be described with reference to the accompanying drawings.

The electroluminescent display device described below may be implemented as a television, a video player, a personal computer PC, a home theater, a smart phone, a virtual reality device (VR), or the like. And, the electroluminescent display device described below will be described as an example of an organic light emitting display device implemented on the basis of an organic light emitting diode. However, the electroluminescent display device described below may be implemented based on an inorganic light emitting diode.

Figure 1:
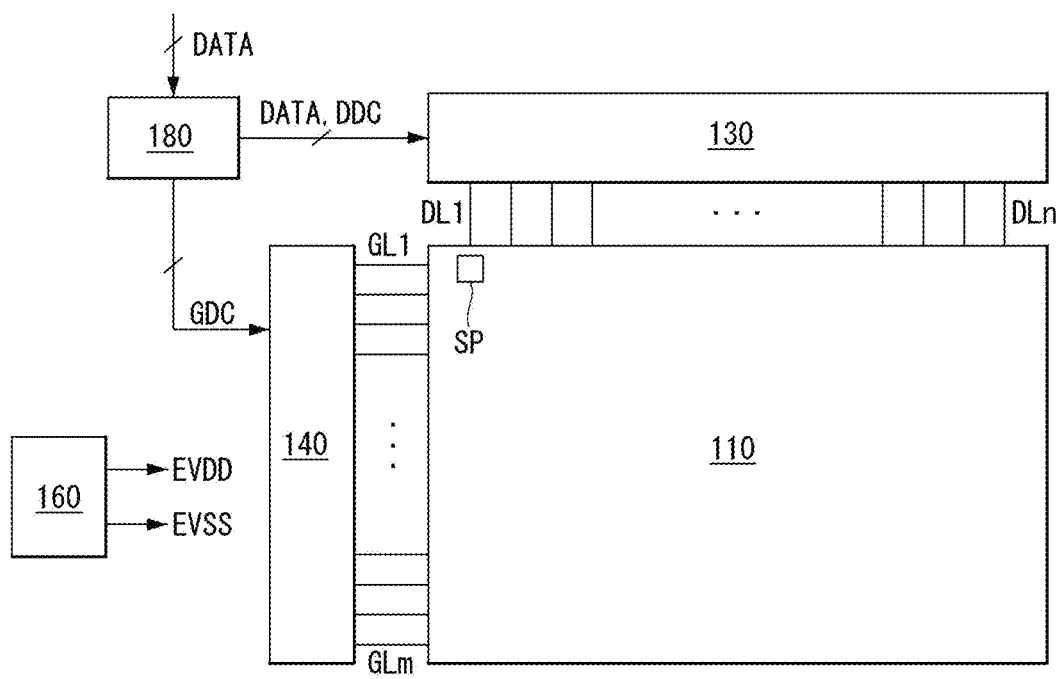
FIG. 1 is a schematic block diagram of an organic electroluminescent display device.
Figure 2:
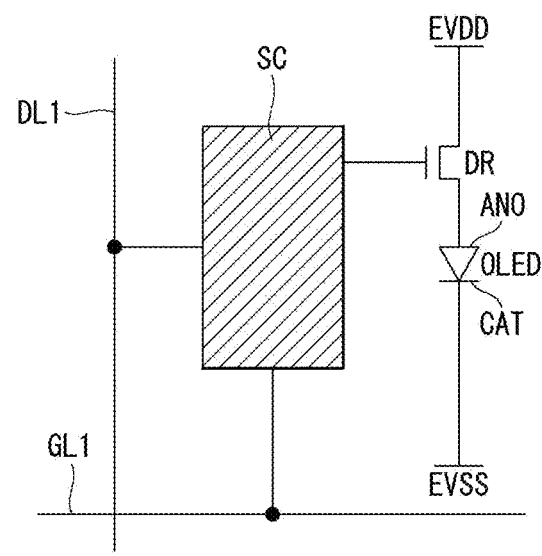
FIG. 2 is a schematic circuit configuration diagram of a subpixel.
Figure 3A:
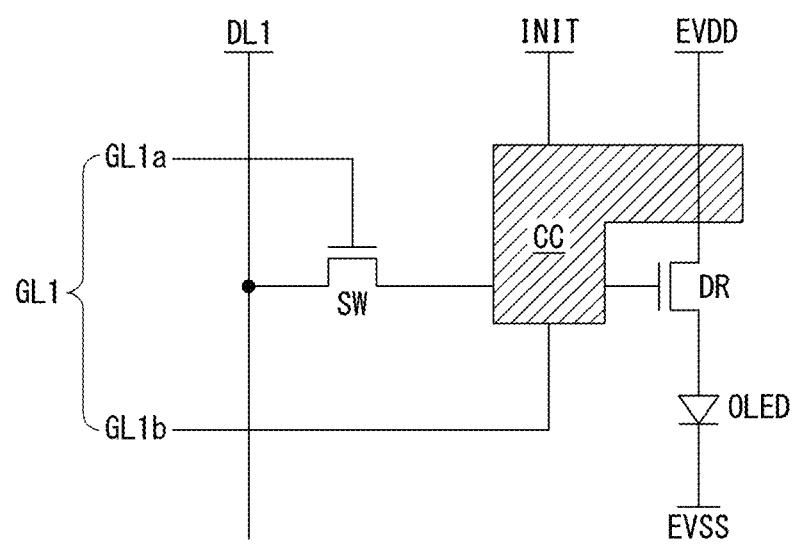
FIGS. 3A and 3B are an exemplary circuit configuration of FIG. 2.
Figure 3B:
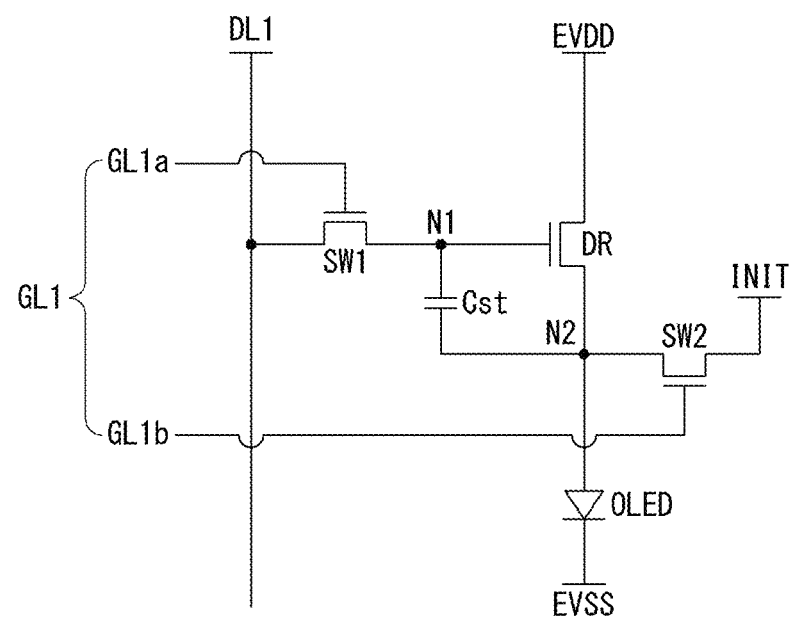
Figure 4:
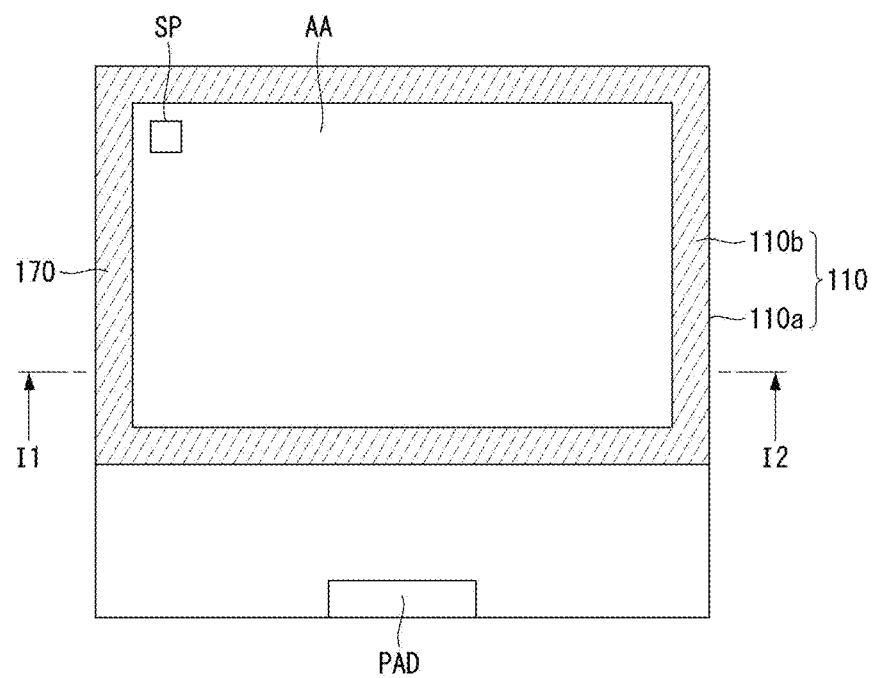
FIG. 4 is a plan view of a display panel.
Figure 5A:
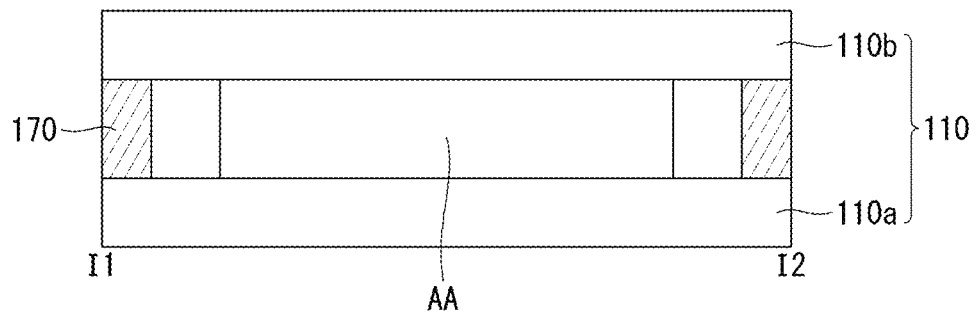
FIGS. 5A and 5B are cross-sectional exemplary views of region 11-12 of FIG. 4.
Figure 5B:
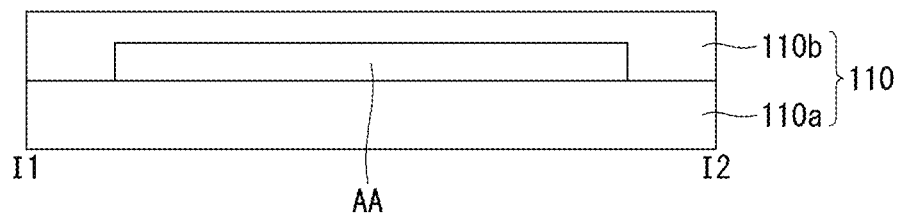

FIG. 1 is a schematic block diagram of an organic electroluminescent display device, FIG. 2 is a schematic circuit configuration diagram of a subpixel, FIG. 3 is an exemplary circuit configuration of FIG. 2, FIG. 4 is a plan view of a display panel, and FIGS. 5A and 5B are cross-sectional exemplary views of region 11-12 of FIG. 4.

As shown in FIG. 1, the organic electroluminescent display device may comprise a timing controller 180, a data driver 130, a scan driver 140, a display panel 110 and a power supply unit 160.

The timing controller 180 is supplied with data signals DATA and driving signals including a data enable signal, a vertical synchronization signal, a horizontal synchronization signal, clock signals, et al. from an image processor (not shown). The timing controller 180 outputs a gate timing control signal GDC for controlling driving timings of the scan driver 140 and a data timing control signal DDC for controlling driving timings of the data driver 130.

In response to the data timing control signal DDC received from the timing controller 180, the data driver 130 samples and latches the data signal DATA supplied from the timing controller 180, converts the digital data signal into an analog data signal (or a data voltage) based on gamma reference voltages and outputs the analog data signal. The data driver 130 outputs the data voltage through data lines DL1 to DLn. The data driver 130 may be formed as an Integrated Circuit IC.

In response to the gate timing control signal GDC received from the timing controller 180, the scan driver 140 output the scan signals. The scan driver 140 output the scan signals through scan lines GL1 to GLm. The scan driver 140 may be form as an IC or formed in a Gate-In-Panel GIP scheme (i.e., the scheme of forming transistor by a thin film process)

The power supply unit outputs a high potential power voltage and a low potential power voltage. The high potential power voltage and the low potential power voltage output from the power supply unit are supplied to the display panel 110. The high potential power voltage is supplied to the display panel 110 through a first power line EVDD and the low potential power voltage is supplied to the display panel 110 through a second power line EVSS.

The display panel 110 displays image based on the data voltages supplied from the data driver 130, the scan signals supplied from the scan driver 140 and power supplied from the power supplied unit 160. The display panel 110 includes subpixels SP emitting light to display image.

The subpixels SP may comprise red subpixels, green subpixels and green subpixels or white subpixels, red subpixels, green subpixels and green subpixels. At least one of the subpixels SP may have an emitting area different from other subpixels depending on emitting characteristics.

As shown in FIG. 2, one subpixel is located in the intersection area of the data line DL1 and the scan line GL1, and includes a programming unit SC for setting a gate-source voltage of a driving transistor DR and an organic light emitting diode OLED.

The OLED includes an anode ANO, a cathode CAT and an organic light emitting layer disposed between the anode ANO and the cathode CAT. The anode ANO is connected to the driving transistor DR.

The programming unit SC may be implemented as a transistor unit including at least one switching transistor and at least one capacitor. The transistor unit may be implemented based on a CMOS semiconductor, a PMOS semiconductor or an NMOS semiconductor. The transistors included in the transistor unit may be implemented in a p type or an n type. And, the semiconductor layer of the transistors included in the transistor unit of the subpixel may comprise amorphous silicon, polysilicon or an oxide.

The switching transistor which is turned on in response to the scan signal supplied via the scan line GL1 applies the data voltage from the data line DL1 to one electrode of the capacitor. The driving transistor DR controls an emitting amount of the OLED by controlling a current according to the level of the voltage charged in the capacitor. The emitting amount of the OLED is proportional to the current amount supplied from the driving transistor DR. And, the subpixel is connected to the first and second power lines EVDD and EVSS to receive the high and low potential power voltages.

As shown in FIG. 3A, the subpixel may comprise an internal compensating circuit CC as well as the switching transistor SW, the driving transistor DR, the capacitor Cst and the OLED described above. The internal compensating circuit CC may comprise at least on transistor connected to a compensating signal line INIT. The internal compensating circuit CC sets the gate-source voltage of the driving transistor DR to a voltage reflecting the threshold voltage of the driving transistor DR, thereby excluding a luminescent variation occurring owing to the threshold voltage when the OLED emits light. In this case, the scan line GL1 includes at least two scan lines GL1a and GL1b, in order to control the switching transistor SW and the transistor of the internal compensating circuit CC.

As shown in FIG. 3B, the subpixel may comprise a switching transistor SW1, the driving transistor DR, a sensing transistor SW2, a capacitor Cst and the OLED. The sensing transistor SW2 is a transistor included in the internal compensating circuit CC, and performs a sensing operation for a compensation driving of the subpixel.

The switching transistor SW1 performs a function of supplying the data voltage supplied through the data line DL1 to a first node N1, in response to the scan signal supplied through the first scan line GL1a. And, the sensing transistor SW2 performs a function of initializing or sensing a second node N2 positioned between the driving transistor DR and the OLED, in response to the sensing signal supplied through the second scan line GL1b.

Meanwhile, the circuit configuration of the subpixel introduced earlier in FIG. 3 is only for the sake of understanding. That is, the circuit of the subpixel according to the present disclosure is not limited thereto, and may be configured to comprise two transistors and one capacitor 2T1C, 3T1C, 4T2C, 5T2C, 6T2C, 7T2C, etc.

As shown in FIG. 4, the display panel 110 includes a lower substrate 110a, an upper substrate 110b, a display area AA, and a pad portion PAD. The display area AA comprises the subpixels SP emitting light. The subpixels SP in the display area AA are sealed because they are vulnerable to moisture or oxygen, but the pad portion PAD comprises pads for electrical connection with an external substrate, so that the pad portion PAD is exposed to the outside.

The display area AA may be disposed to occupy almost all the surfaces of the lower substrate 110a and the pad portion PAD may be disposed at one side of the lower substrate 110a. The display panel 110 is implemented in a rectangular shape as an example, but may be formed in various shapes such as a pentagon, a hexagon, a polygon, a circle, and an ellipse.

As shown in FIGS. 4 and 5A, the display area AA may be sealed by sealing members 170 disposed between the lower substrate 110a and the upper substrate 110b. AS shown in FIGS. 4 and 5B, the display area AA may be sealed only by the lower substrate 110a and the upper substrate 110b.

The display panel 110 may have various shapes such as a flattened shape, a shape that can be flexibly bent or unfolded, a shape having a curved surface, and the like. And, the display panel 110 may be implemented in a bottom emission structure in which light is emitted toward the lower substrate 110a, a top emission structure in which light is emitted toward the upper substrate 110b, a dual emission structure in which light is emitted toward the lower substrate 110a and the upper substrate 110b, etc. So, the sealing structure of the display panel 110 may be selected according to the type to be implemented, and is not limited to the description of FIGS. 4, 5A and 5B.

A First Aspect

Figure 6:
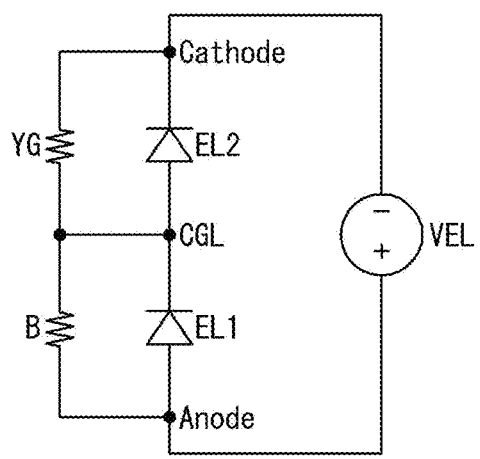
FIGS. 6 and 7 are views for explaining an organic electroluminescent display device according to a first aspect of the present disclosure.
Figure 7:
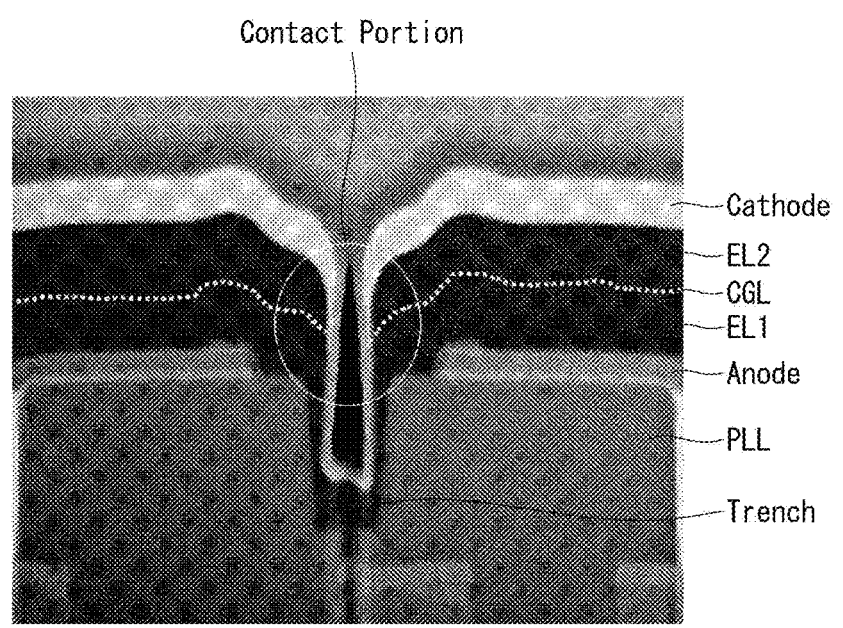

FIGS. 6 and 7 are views for explaining an organic electroluminescent display device according to a first aspect of the present disclosure.

As shown in FIGS. 6 and 7, the organic electroluminescent display device according to the first aspect of the present disclosure is implemented based on a white light emitting diode having two stacks of light emitting layers. The white light emitting diode having two stacks may be implemented as a light emitting layer made of an organic material or a light emitting layer made of an inorganic material, but the light emitting layer made of the organic material will be described below as an example.

The 2 stack white organic light emitting diode has a structure in which two light emitting layers EL1 and EL2 located at different layers emit white light by a positive voltage (+) an anode electrode Anode and a negative voltage (−) applied to a cathode electrode Cathode. VEL is a power source in FIG. 6.

The 2 stack white organic light emitting diode according to the first aspect has a stack structure comprising the anode electrode Anode, a first light emitting layer EL1, a charge generating layer CGL, a second light emitting layer EL2 and the cathode Cathode. The first and second light emitting layers EL1 and EL2 includes a common layer for controlling the injection and transport of electrons and holes as well as a light emitting layer for emitting light, respectively.

The first and second light emitting layers EL1 and EL2 include materials for emitting light of different colors, but emit white light when they emit light. As a first example, the first light emitting layer EL1 may include a material for emitting blue color (B) and the second light emitting layer EL2 may include a material for emitting yellowish green color (YG) (or yellow color). However, this is only an example, so a structure in which the first light emitting layer EL1 includes a material for emitting yellowish green color (YG) and the second light emitting layer EL2 includes a material for emitting blue color (B), that is, a structure opposite to that of the first example, may be implemented.

The 2 stack white organic light emitting diode according to the first aspect may be formed on an insulating layer having a flat surface such as a planarization layer PLL. Trenches (or grooves) are formed on the planarization layer PLL to form a certain depth and width and recessed from the surface. The trenches are formed in a large number to serve to define the region between the subpixels.

A trench is formed in the form of a closed curve that surrounds all the periphery of a unit subpixel to define the area between respective subpixels. As a result, the 2 stack white organic light emitting diodes are formed separately for each subpixel by a plurality of trenches formed on the planarization layer PLL. Since the trenches are formed to separate the subpixels from the subpixels, so the trenches may have a shape such as a triangle, a rectangle, a rhombus, a polygon, a circle, an ellipse, etc. according to the shape of the subpixel, but are not limited thereto.

The 2 stack white organic light emitting diode according to the first aspect comprise a first subpixel electrically connected to the charge generating layer CGL and the cathode electrode Cathode and a second subpixel which is not electrically connected to the charge generating layer CGL and the cathode electrode Cathode. The charge generating layer CGL may comprise a conductive material such as lithium Li and calcium Ca which may cause an electrical short to the cathode electrode Cathode, but is not limited thereto.

According to an experiment, in the first subpixel electrically connected to the charge generating layer CGL and the cathode electrode Cathode, the second light emitting layer EL2 does not emit light and only the first light emitting layer EL1 emits light. On the other hand, in the second subpixel which is not electrically connected to the charge generating layer CGL and the cathode electrode Cathode, both the first and second light emitting layers EL1 and EL2 emit light. That is, the first subpixel emits blue light and the second subpixel emits both of the blue light and yellowish green light, thereby emitting white light.

Thus, the trench serves to define the region between the subpixels, as well as to help contact or separation between the layers at a specific location. The first subpixel and the second subpixel described above are distinguished by adjusting the width of at least one of the plurality of trenches.

So, the width of the trench distinguishes between the first and second subpixels and also corresponds to a factor that determines structural characteristics, such as whether to provide a structure to assist or separate the contact between layers at a particular location.

For example, the first subpixel has a first trench of a first width (wide width) for contact between the charge generating layer CGL and the cathode electrode Cathode, while the second subpixel has a second trench of a second width (narrow width) for non-contact between the charge generating layer CGL and the cathode electrode Cathode. That is, the first and second trenches have different widths.

In the case of the first trench, it is described that the first trench is included in the first subpixel because it also serves to assist the contact between the charge generating layer CGL and the cathode electrode Cathode in addition to defining the region between the subpixels. However, it is only for convenience of explanation, and in practical terms it is closer to the fact that the first subpixel and the second subpixel share the first trench. Therefore, depending on the arrangement of the subpixels, first and second trenches may be disposed together between two subpixels positioned at a first location, and only a first trench or only a second trench may be disposed between two subpixels positioned at a second location.

FIG. 7 shows a portion of a trench having a wide width. Referring to the portion, it can be clearly seen how the charge generating layer CGL and the cathode electrode Cathode are electrically connected. The description with reference to FIG. 7 is added as follows.

The first light emitting layer EL1 is formed through a deposition process preceding the charge generating layer CGL and the second light emitting layer EL2. So, the first light emitting layer EL1 is deposited while digging along a wide width of the trench and at this time the width of the trench is significantly narrowed. On the other hand, the charge generating layer CGL and the second light emitting layer EL2 are formed through deposition processes following the first light emitting layer EL1. So, the charge generating layer CGL and the second light emitting layer EL2 cannot penetrate into the interior of the trench and are deposited only on an exposed upper surface of the first light emitting layer EL1.

Therefore, the charge generating layer CGL and the second light emitting layer EL2 form a profile in which the left and right sides are separated from each other around the trench as shown in the figure. And, as the left and right sides are separated, the side surfaces as well as the upper surfaces of the charge generating layer CGL and the second light emitting layer EL2 become exposed. The side surfaces of the charge generating layer CGL and the second light emitting layer EL2 are exposed inside the trench.

Thereafter, the cathode electrode Cathode is deposited on the exposed upper surfaces of the second light emitting layer EL2 and also on the side surfaces of the first light emitting layer EL1 existing inside the trench, while penetrating into the interior of the trench. As a result, the trench having a wide width provides a contacting structure (side contacting structure) which causes an electrical short between the cathode electrode Cathode and the charge generating layer CGL.

Unlike the trench having a wide width, in a trench having a narrow width, the charge generating layer CGL and the second light emitting layer EL2 form a profile in which a right side and a left side are separated around the trench. However, the cathode electrode Cathode cannot penetrate into the inside of the trench and is deposited only on an exposed upper surface of the second light emitting layer EL2. The reason for this is briefly explained as follows.

A trench having a narrow width provides a limited space to the inside of which only a part of the first light-emitting layer EL1 can penetrate. Therefore, the space formed by the trench having a narrow width is closed simultaneously with the deposition of the second light emitting layer EL2 which is thicker than the charge generating layer CGL. As a result, the trench having a narrow width provides a non-contact structure which does not cause an electrical short between the cathode electrode Cathode and the charge generating layer CGL.

As described above, when at least two trenches of different sizes are formed, it is possible to form subpixels based on 2 stack organic white light emitting diodes by one deposition. And, subpixels may be divided into a first subpixel emitting blue light and a second subpixel emitting white light. That is, the first aspect can manufacture, by one deposition, a display panel having a two-color sub-pixel structure in which two or more colors including blue color and white color are emitted, so is advantageous in terms of process cost reduction and material cost reduction.

The 2 stack white organic light emitting diode has a same laminated structure as the first aspect, but due to the trenches having different widths, one emits light in a single stack form and the other emits light in a double stack form.

In the following aspects, the structures of an organic electroluminescent display device that can be manufactured based on the first aspect will be described in further detail. However, the structures of the organic electroluminescent display device based on the first aspect are not limited to the following explanations.

A Second Aspect

Figure 8:
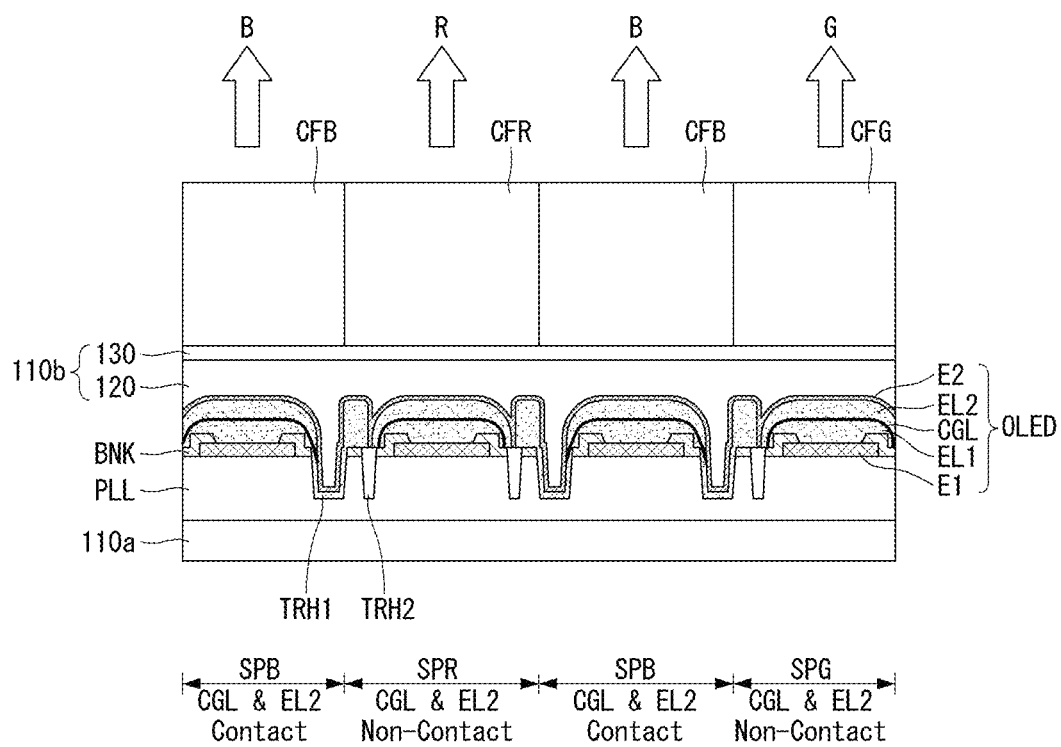
FIG. 8 is a view for explaining an organic electroluminescent display device according to a second aspect of the present disclosure.

FIG. 8 is a view for explaining an organic electroluminescent display device according to a second aspect of the present disclosure.

As shown in FIG. 8, the display panel of an organic electroluminescent display device according to a second aspect of the present disclosure is also implemented based on the 2 stack white organic light emitting diode described above in the first aspect.

The display panel includes a first substrate 110a and a second substrate 110b. The first substrate 110a is made of glass or resin. The second substrate 110b is a multi-layer thin film or a film and may include a first layer 120 and a second layer 130 which are alternately deposited with organic and inorganic materials.

Color filter layers CFR, CFG and CFB are positioned on the second substrate 110b. The color filter layers CFR, CFG and CFB performs a function of converting a white light output through the second substrate 110b into a red light R, a green light G and a blue light B. To this end, the color filter layers CFR, CFG and CFB are arranged at sizes corresponding to the regions of the subpixels SPR, SPG and SPB. However, the types of colors that can be converted into by the color filter layers CFR, CFG and CFB are not limited to these.

The planarization layer PLL is positioned on the first substrate 110a. The planarization layer PLL has a predetermined thickness and performs a function of flattening the surface of the first substrate 110a. The planarization layer PLL may be formed of organic materials such as a negative overcoat layer, polyimide, benzocyclobutene series resin, acrylate, photoacrylate, and the like, but is not limited thereto.

A lower electrode layer E1 is positioned on the planarization layer PLL. The lower electrode layer E1 becomes an anode electrode or a cathode electrode. For instance, when the lower electrode layer E1 is selected as the anode electrode, it may be made of oxides such as indium tin oxide ITO or indium zinc oxide IZO, but is not limited thereto.

A bank layer BNK is positioned on the planarization layer PLL. The bank layer BNK exposes a part of the lower electrode layer E1 while covering the lower electrode layer E1. The bank layer BNK performs a function of defining an emitting area of a subpixel. The bank layer BNK may be made of organic materials such as polyimide, benzocyclobutene series resin, acrylate, photoacrylate, and the like, but is not limited thereto.

A first emitting layer EL1 is positioned on the upper electrode layer E1. The first emitting layer EL1 emits light of a first color. The first emitting layer EL1 is defined as a first stack. The first emitting layer EL1 includes a light emitting layer for emitting light and a common layer for controlling the injection and transport of electrons and holes.

A charge generating layer CGL is positioned on the lower electrode layer E1. The charge generating layer CGL may be formed in the form of a PN junction in which an N-type charge generating layer and a P-type charge generating layer are bonded or a NP junction of vice versa. The charge generating layer CGL serves to generate charges or separate holes and electrons and inject charges into layers which are separated into a first stack and a second stack. An N-type charge generating layer provides electrons to the first emitting layer EL1 and a P-type charge generating layer provides holes to the second emitting layer EL2, which may function to further lower a driving voltage of a device having a plurality of light emitting layers while further increasing the luminous efficiency of the device.

The N-type charge generating layer is made of a metal or an organic material doped with an N-type. The metal may be a material selected from the group consisting of Li, Na, K, Rb, Cs, Mg, Ca, Sr, Ba, La, Ce, Sm, Eu, Tb, Dy and Yb. An N-type dopant used for the organic material doped with the N-type and a material of a host may be materials conventionally used. For example, the N-type dopant may be an alkali metal, an alkali metal compound, an alkaline earth metal or an alkaline earth metal compound. The N-type dopant may be selected from the group consisting of Cs, K, Rb, Mg, Na, Ca, Sr, Eu and Yb. And, the host may be a material selected from the group consisting of tris (8-hydroxyquinoline) aluminum, triazine, hydroxyquinoline derivatives, benzazole derivatives and silole derivatives.

The P-type charge generating layer is made of a metal or an organic material doped with a P-type. The metal may be composed of one or more alloys selected from the group consisting of Al, Cu, Fe, Pb, Zn, Au, Pt, W, In, Mo, Ni and Ti. A P-type dopant used for the organic material doped with the P-type and a material of a host may be materials conventionally used. For example, the P-type dopant may be selected from the group consisting of 2,3,5,6-tetrafluoro-7,7,8,8-tetracyanoquinodimethane (F4-TCNQ), derivatives of tetracyanoquinodimethane, iodine, $FeCl_3$, $FeF_3$ and $SbCl_5$. And, the host may be selected from the group consisting of N,N'-di(naphthalene-1-yl)-N,N-diphenyl-benzidine(NPB), N,N-diphenyl-N,N'-bis(3-methylphenyl)-1,1-biphenyl-4,4'-diamine(TPD) and N,N',N'-tetranaphthyl-benzidine(TNB).

The second emitting layer EL2 is positioned on the charge generating layer CGL. The second emitting layer EL2 emits light of a second color different from the first color. The second emitting layer EL2 is defined as a second stack. The second emitting layer EL2 includes a light emitting layer for emitting light and a common layer for controlling the injection and transport of electrons and holes.

An upper electrode layer E2 is positioned on the second emitting layer EL2. The upper electrode layer E2 becomes a cathode electrode or an anode electrode. For instance, when the upper electrode layer E2 is selected as the cathode electrode, it may be made of, but not limited to, aluminum (Al), magnesium (Mg), silver (Ag) or an alloy thereof having a low work function.

The 2 stack white organic light emitting diode OLED is formed on the planarization layer PLL. A plurality of first trenches TRH1 and second trenches TRH2, which have a predetermined depth and width and are recessed from a surface, are formed on the planarization layer PLL. The first trench TRH1 and the second trench TRH2 have different sizes to perform different functions.

The first trench TRH1 serves to define an area between subpixels SPB, SPR and SPG. By the first trench TRH1, the 2 stack white organic light emitting diode OLED is formed separately for each of the subpixels SPB, SPR and SPG on the planarization layer PLL. The first trench TRH1 serves to help an electrical contact between the charge generating layer CGL and the upper electrode layer EL2 as well as to define an area between the subpixels SPB, SPR and SPG. Different from this, the second trench TRH2 serves to help an electrical separation between the charge generating layer CGL and the upper electrode layer EL2. To this end, the first trench TRH1 has a wider width than the second trench TRH2, and the second trench TRH2 has a narrower width than the first trench TRH1.

In the second aspect, the 2 stack white organic light emitting diode is formed based on the trenches TRH1 and TRH2 of the above-described structure, so has a first subpixel in which the charge generating layer CGL and the upper electrode layer EL2 are electrically connected and a second subpixel in which the charge generating layer CGL and the upper electrode layer EL2 are not electrically connected.

The first subpixel may include a blue subpixel SPB having a blue color filter layer CFB and the first trench TRH1 in the "CGL & EL2 contact" portion. Since the charge generating layer CGL is electrically connected to the upper electrode layer EL2, only the first emitting layer EL1 emits light in the first subpixel. A blue light emitted from the first emitting layer EL1 is output through the blue color filter layer CFB.

The second subpixel may include a red subpixel SPR having a red color filter layer CFR, the first trench TRH1 and the second trench TRH2 and a green subpixel SPG having a green color filter layer CFG, the first trench TRH1 and the second trench TRH2 in the "CGL & EL2 non-contact" portion. Since the charge generating layer CGL is not electrically connected to the upper electrode layer EL2, both of the first emitting layer EL1 and the second emitting layer EL2 emit light in the second subpixel. A white light emitted from the first and second emitting layers EL1 and EL2 is output through the red color filter layer CFR and the green color filter layer CFG, respectively.

As a result of an electrical characteristics test, the second aspect has (1) a driving voltage reduction effect in terms of individual elements and (2) a power saving effect in terms of a display panel, because it has the first subpixel which is driven only by a single stack. In addition, the first sub-pixel driven only by the single stack has the effect of outputting a higher luminance (brightness enhancement) even when a same voltage as the second subpixel is applied.

As described above, according to the second aspect, a display panel capable of expressing various colors can be manufactured based on a two-color subpixel structure that emits two or more colors of a blue subpixel and a white subpixel, so there are advantages of reducing a process cost and a material cost. Also, according to the second aspect, a two color emitting display panel can be manufactured which drive a predetermined subpixel such as a blue subpixel in the form of a single stack but not two stacks, so there are advantages of lowering a driving voltage, reducing a power consumption and increasing luminance.

A Third Aspect

Figure 9A:
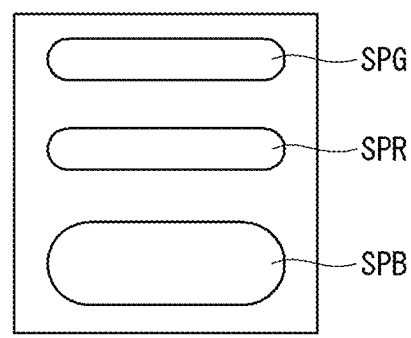
FIGS. 9A, 9B, and 10 are views for explaining an organic electroluminescent display device according to a third aspect of the present disclosure.
Figure 9B:
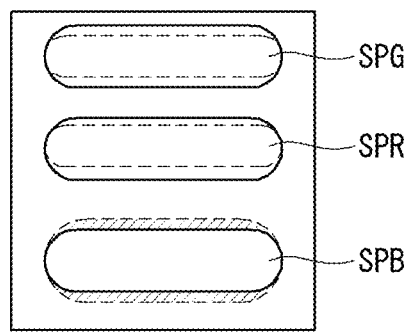
Figure 10:
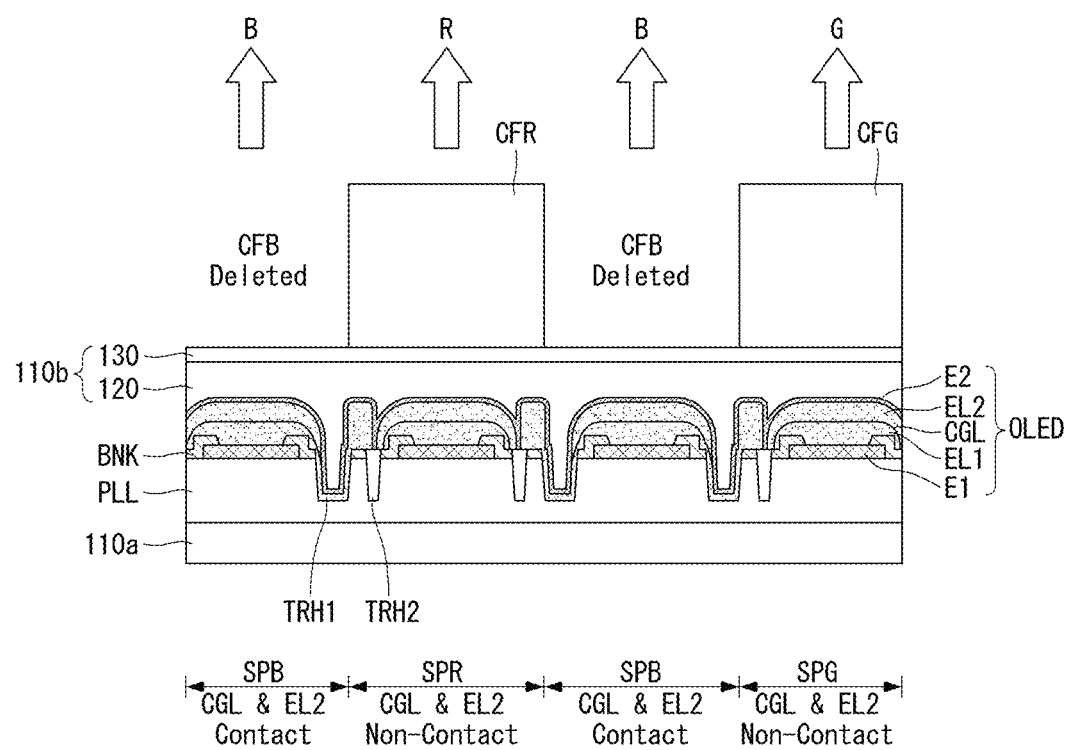

FIGS. 9A, 9B and 10 are views for explaining an organic electroluminescent display device according to a third aspect of the present disclosure.

As shown in FIGS. 9A, 9B and 10, a display panel of an organic electroluminescent display device according to the third aspect of the present disclosure is also implemented based on the 2 stack white organic light emitting diode described in the second aspect.

If a display panel is manufactured based on the third aspect, subpixels SPR, SPG and SPB such as FIG. 9A or subpixels SPR, SPG and SPB such as FIG. 9B may be designed, which will be described as follows by referring to FIGS. 9A, 9B and 10.

As shown in FIGS. 9A, 9B and 10, when manufacturing a display panel based on the third aspect, a blue color filter layer CFB which is requested in a blue subpixel SPB belonging to a first subpixel can be deleted (omitted or not included). The reason is that only a first emitting layer EL1 which emits light of a blue color B in the first subpixel emits light, as described above in the second aspect.

Since the third aspect omits only a portion corresponding to the blue color filter layer CFB when forming a color filter layer, a material cost can be reduced. And, since the blue light emitted from the first light emitting layer EL1 is emitted without being converted through the blue color filter layer CFB, there is an advantage that an emitting efficiency and a luminance can be simultaneously increased.

As a result, when forming the subpixels SPR, SPG and SPB, the condition such as "SPG≈SPR<SPB" may be applied as FIG. 9A, or the condition such as "SPG≈SPR-≈SPB" may be applied as FIG. 9B Thus, in accordance with a display panel manufacturing method of the third aspect, it is not necessary to make an emission area of the blue subpixel SPB larger than that of the red and green subpixels SPR and SPG, in order to solve a white balance non-uniformity problem due to a low emitting efficiency and a luminance deficiency of the blue subpixel SPB, and it is possible to make all the subpixels have a same size.

The third aspect can manufacture the display panel which can represent various colors based on the two-color subpixel structure which emits two or more colors, so it has advantages in process cost reduction and material cost reduction. And, third aspect can manufacture two-color emitting display panel which drives a predetermined subpixel such as the blue subpixel in a single stack form instead of two stacks, which is advantageous in lowering a driving voltage and reducing power consumption. Also, the third aspect is advantageous in that the blue color filter layer can be eliminated in forming the color filter layer, thereby improving an emitting efficiency and a luminance, and reducing a material cost.

A Fourth Aspect

Figure 11:
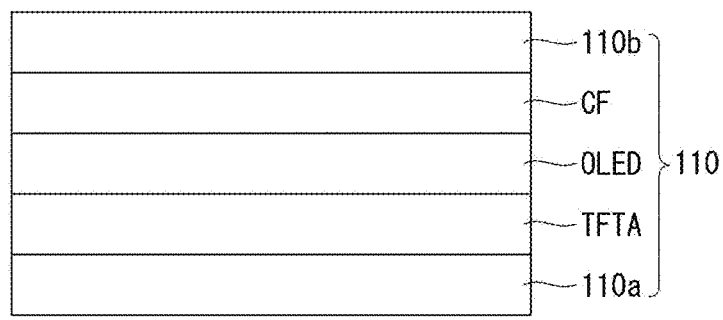
FIGS. 11, 12, and 13 are views for explaining an organic electroluminescent display device according to a fourth aspect of the present disclosure.
Figure 12:
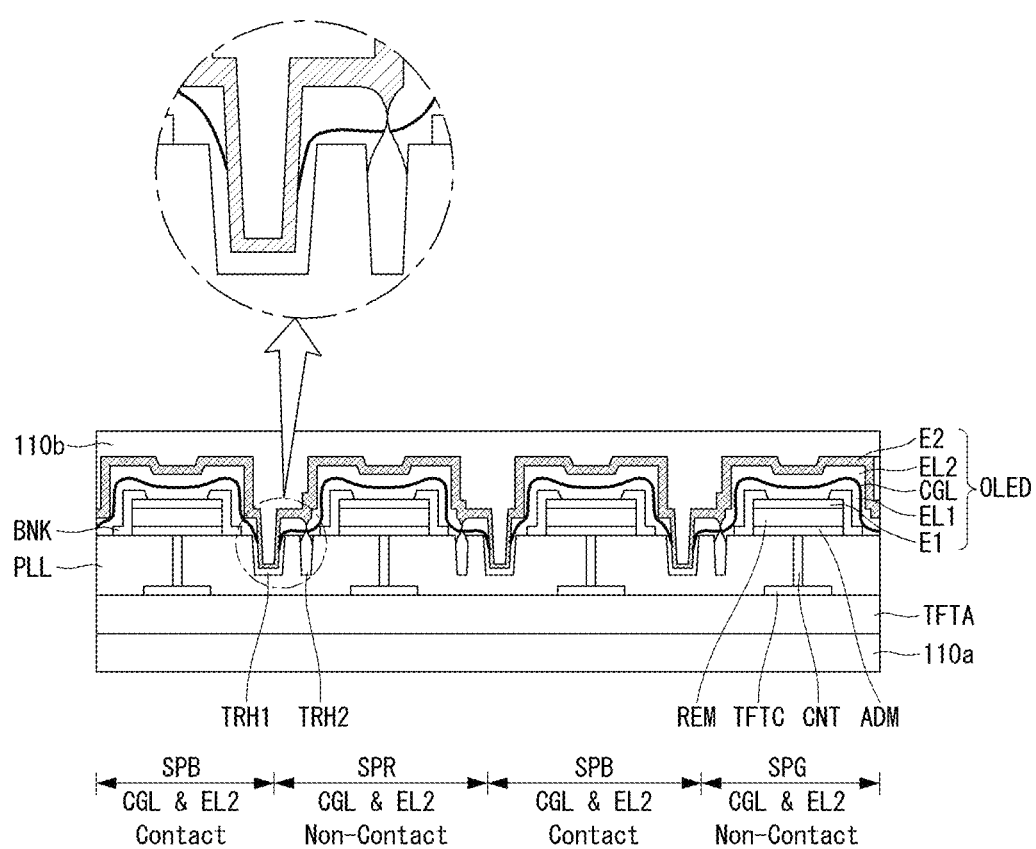
Figure 13:
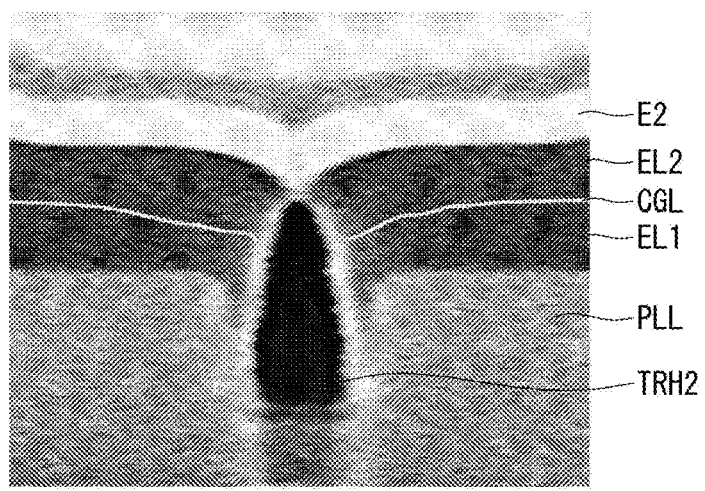
Figure 14:
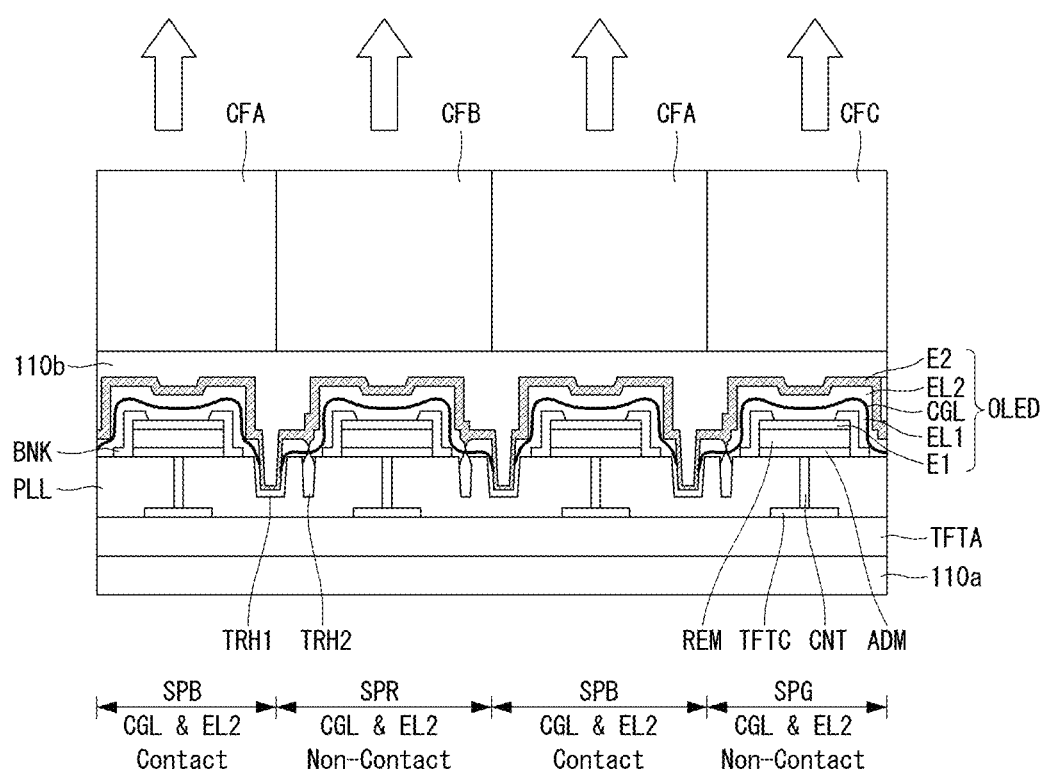
FIGS. 14, 15, 16A, and 16B are views for explaining a modification of the fourth aspect of the present disclosure.
Figure 15:
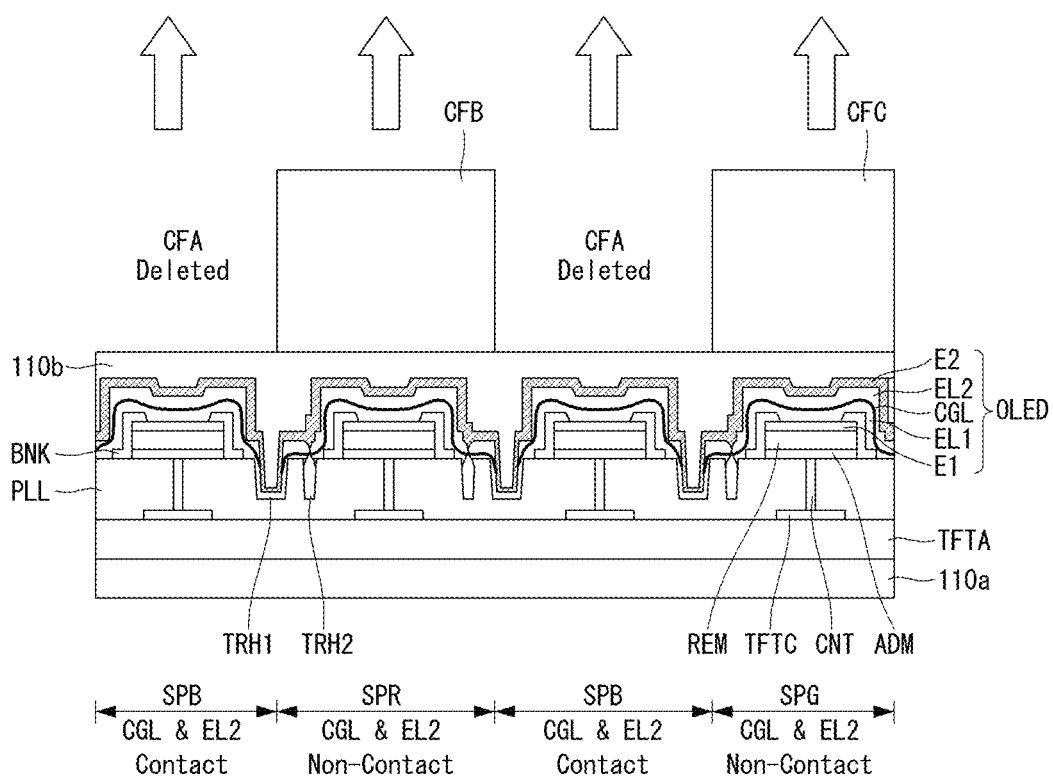

FIGS. 11 to 13 are views for explaining an organic electroluminescent display device according to a fourth aspect of the present disclosure, and FIGS. 14 to 16 are views for explaining a modification of the fourth aspect of the present disclosure.

As shown in FIG. 11, a display panel of an organic electroluminescent display device according to the fourth aspect of the present disclosure is also implemented based on the 2 stack white organic light emitting diode described in the second aspect.

The display panel 110 includes a first substrate 110a and a second substrate 110b. The first and second substrate 110a and 110b are made of glass, resin or a film. A transistor portion TFTA, a two stack white organic light emitting diode OLED and a color filter layer CF are disposed between the first substrate 110a and the second substrate 110b. The transistor portion TFTA includes a switching transistor, a driving transistor, and the like. The transistor portion TFTA has various structures depending on a manufacturing method of the transistors, and is not specifically shown.

As shown in FIG. 12, the 2 stack white organic light emitting diode OLED further includes metal layers TFTC, CNT, ADM and REM for helping an electrical connection with the transistor portion TFTA and helping the light generated from the emitting layers EL1 and EL2 to emit upward. Note that one of the metal layers TFTC, CNT, ADM and REM described below may be eliminated or integrated depending on the manufacturing method of the device.

A first metal layer TFTC is positioned on the transistor portion TFTA. The first metal layer TFTC may become a source electrode layer or a drain electrode layer included in a driving transistor or may be selected as a separate metal layer connected to the source electrode layer or the drain electrode layer. The first metal layer TFTC serves as an electrode contact metal layer to facilitate an electrical connection between the source or drain electrode of the driving transistor and the lower electrode layer E1.

A second metal layer CNT is positioned to penetrate the planarization layer PLL. The second metal layer CNT is electrically connected to the first metal layer TFTC exposed under the planarization layer PLL. The second metal layer CNT also serves as the electrode contact metal layer to facilitate the electrical connection between the source or drain electrode of the driving transistor and the lower electrode layer E1 together with the first metal layer TFTC.

A third metal layer ADM is positioned on the planarization layer PLL. The third metal layer ADM is electrically connected to the second metal layer CNT penetrating the planarization layer PLL. The third metal layer ADM and the second metal layer CNT may be integrally formed, but may be formed separately as shown in FIG. 12. The third metal layer ADM serves to increase an adhesive force at a surface of the planarization layer PLL and serves as the electrode contact metal layer to facilitate the electrical connection between the source or drain electrode of the driving transistor and the lower electrode layer E1 together with the first and second metal layers TFTC and CNT.

A fourth metal layer REM is positioned on and electrically connected to the third metal layer ADM. The fourth metal layer REM serves as a reflecting layer to help the light generated from the emitting layers EL1 and EL2 to emit upward. Also, the fourth metal layer REM serves as the electrode contact metal layer to facilitate the electrical connection between the source or drain electrode of the driving transistor and the lower electrode layer E1 together with the first to third metal layers TFTC, CNT and ADM.

In the fourth aspect, the 2 stack white organic light emitting diode is formed based on trenches TRH1 and TRH2 of a same structure as the second aspect, so comprises a first subpixel in which the charge generating layer and the upper electrode layer EL2 are electrically connected and a second subpixel in which the charge generating layer and the upper electrode layer EL2 are not electrically connected.

The first subpixel may include an A subpixel SPA having a first trench TRH1 in the "CGL & EL2 contact" portion. Since the charge generating layer and the upper electrode layer EL2 are electrically connected in the first subpixel, only the first emitting layer EL1 emits light.

The second subpixel may include a B subpixel SPB having the first trench TRH1 and a second trench TRH2 and a C subpixel SPC having the first and second trenches TRH1 and TRH2 in the "CGL & EL2 Non-contact" portion. Since the charge generating layer and the upper electrode layer EL2 are not electrically connected in the second subpixel, both of the first and second emitting layers EL1 and EL2 emit light.

Color filter layers are not shown in FIG. 12. This is because a color filter layer may be located above the second substrate 110b as well as between the second substrate 110b and the upper electrode layer E1 as in the second aspect.

FIG. 12 adds an enlarged view of a structure related to the first trench TRH1 and the second trench TRH2. And, FIG. 13 shows an enlarged image related to a profile in which left and right structures are separated around a narrow second trench TRH2.

As known from the first trench of FIG. 7 Trench and the second trench of FIG. 13 TRH2, trenches TRH1 and TRH2 may be electrically contacted to or separated from the charge generating layer CGL depending on sizes of widths of the trench. And, according to this characteristic, subpixels based on the 2 stack white organic light emitting diode may be formed with a single deposition. Thus, since the width and depth of the structure such as the first trench of FIG. 7 Trench and the second trench of FIG. 13 TRH2 may be factors determining a profile of organic layers, so they are optimized through repeated experiments.

In addition, according to the fourth aspect, a display panel such as FIG. 14 which has all of the first to third color filter layers CFA, CFB and CFC on an upper surface of the second substrate 110b (or a lower surface of the second substrate) can be manufactured. And, according to the fourth aspect, a display panel such as FIG. 15 which has only the second and third color filter layers CFB and CFC without the first color filter layer CFA on an upper surface of the second substrate 110*b* (or a lower surface of the second substrate) can be manufactured.

Figures 16A, 16B:
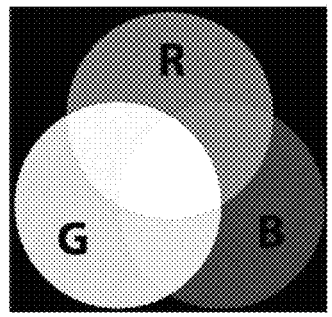

As shown in FIGS. 12 and 16A, a display panel may represent a white color by blending three primary colors of red R, green G and blue B or blending colors such as purple red (Magenta), cyan (Cyan), and yellowish green YG (or yellow). Thus, the first and second emitting layers EL1 and EL2 may respectively emits a blue color Blue and a yellowish green color YG or may be implemented like the combinations shown in FIG. 16B.

As shown in FIGS. 12 and 16B, a display panel may represent a white color by using the first and second emitting layers EL1 and EL2 based on red, green and blue filter layers, or based on purple red, cyan and yellowish green filter layers. Examples for this are as follows.

According to the fourth aspect, the first emitting layer EL1 may emit a blue color Blue and the second emitting layer EL2 may emit a yellowish green color YG. In this case, a blue color filter layer (Blue CF) can be omitted. However, according to a first modification, the first and second emitting layers EL1 and EL2 may respectively emit a green color Green and a purple red color Magenta. In this case, a green color filter layer (Green CF) can be omitted. And, according to a second modification, the first and second emitting layers EL1 and EL2 may respectively emit a red color Red and a cyan color Cyan, and in this case a red color filter layer (Red CF) can be omitted.

According to a third modification, the first and second emitting layers EL1 and EL2 may respectively emit a yellowish green color YG and a blue color Blue, and in this case a yellowish green color filter layer or a yellow color filter (Y CF) can be omitted. According to a fourth modification, the first and second emitting layers EL1 and EL2 may respectively emit a purple red color Magenta and a green color Green, and in this case a purple red color filter layer (M CF) can be omitted. And, according to a fifth modification, the first and second emitting layers EL1 and EL2 may respectively emit a cyan color Cyan and a red color Red, and in this case a cyan color filter layer (C CF) can be omitted.

The fourth aspect can manufacture a display panel which can represent various colors based on the 2 color subpixel structure including a blue subpixel and a white subpixel to emit two or more colors, thereby reducing a process cost and a material cost. And, the fourth aspect can manufacture a two-color emitting display panel which drives a predetermined subpixel such as a blue subpixel in a single stack form instead of two stacks, which is advantageous in lowering a driving voltage and reducing power consumption. Also, the fourth aspect is advantageous in that the blue color filter layer can be eliminated in forming the color filter layer, thereby improving an emitting efficiency and a luminance and reducing a material cost. And, the fourth aspect can add a metal layer which reflects light generated from the emitting layers as well as electrically connects electrodes located on different layers, which is advantageous in enhancing an ability to emit light.

According to the present disclosure, a display panel capable of representing various colors can be manufactured based on a two-color subpixel structure that emits two colors of a blue subpixel and a white subpixel. Also, the present disclosure has the effect of lowering a driving voltage, reducing power consumption, improving luminous efficiency and luminance, reducing a material cost, and improving light output capability based on a subpixel structure emitting at least two colors.

What is claimed is:

1. An electroluminescent display device, comprising:
   a lower substrate;
   an insulating layer positioned on the lower substrate and including a plurality of trenches; and
   a plurality of subpixels positioned on the insulating layer and including:
      a first electrode on the insulating layer;
      a first light emitting layer on the first electrode;
      a charging generating layer on the first light emitting layer;
      a second light emitting layer on the charging generating layer; and
      a second electrode on the second light emitting layer,
   wherein the plurality of subpixels includes a first subpixel in which only one of the first and second light emitting layers emits light by a contact between the charging generating layer and the second electrode in one of the plurality of trenches, and a second subpixel in which both of the light emitting layers emit light by a separation of the charging generating layer and the second electrode in another one of the plurality of trenches.

2. The electroluminescent display device of claim 1, wherein the plurality of trenches includes a first trench having a first width and a second trench having a second width narrower than the first width.

3. The electroluminescent display device of claim 2, wherein the first subpixel has a structure in which lateral sides of a charge generating layer between a first light emitting layer and a second light emitting layer contact the second electrode disposed in the first trench, and
   wherein the second subpixel has a structure in which the lateral sides of the charge generating layer between the first light emitting layer and the second light emitting layer are separated from the second electrode disposed in the second trench.

4. The electroluminescent display device of claim 1, wherein the only one light emitting layer emitting light in the first subpixel is located under the other light emitting layer, and wherein the both of two light emitting layers the second subpixel emit light.

5. The electroluminescent display device of claim 1, wherein the plurality of trenches has a closed curve shape.

6. An electroluminescent display device, comprising:
   a display panel including subpixels comprising a two stack white light emitting diode having two light emitting layers which emit light of different colors and a color filter layer converting the light emitted from the two stack white light emitting diode; and
   wherein each of the two stack white light emitting diode includes:
      a first electrode on an insulating layer;
      a first light emitting layer on the first electrode;
      a charging generating layer on the first light emitting layer;
      a second light emitting layer on the charging generating layer; and
      a second electrode on the second light emitting layer,
   wherein the subpixels includes:
      a first subpixel in which only one light emitting layer of the two light emitting layers emits light by a contact between the charging generating layer and the second electrode in first trench of the insulating layer; and a second subpixel in which both of the two light emitting layers emit light by a separation of the charging generating layer and the second electrode in a second trench of the insulating layer adjacent to the first trench.

7. The electroluminescent display device of claim 6, wherein the first subpixel has a structure in which lateral sides of the charge generating layer contact the second electrode disposed in the first trench, and the second subpixel has a structure in which the lateral sides of the charge generating layer are separated from the second electrode disposed in a second trench.

8. The electroluminescent display device of claim 6, wherein the first subpixel does not include the color filter layer and the second subpixel includes the color filter layer.

9. The electroluminescent display device of claim 6, wherein a width of the second trench is narrower than a width of the first trench.

10. An electroluminescent display device having a substrate, comprising:
   an insulating layer disposed on the substrate and including a first trench and a second trench adjacent to the first trench;
   a first electrode on the insulating layer;
   a first light emitting layer on the first electrode;
   a charging generating layer on the first light emitting layer;
   a second light emitting layer on the charging generating layer; and
   a second electrode on the second light emitting layer,
   wherein only the first light emitting layer emits first color light by a contact between the charging generating layer and the second electrode in the first trench; and
   wherein both of the first and second light emitting layers emitting second color light by a separation of the charging generating layer and the second electrode in a second area adjacent to the second trench area, wherein the first color and the second are different from each other.

11. The electroluminescent display device of claim 10, wherein the first and second trenches define a first subpixel emitting the first color and a second subpixel emitting the second color in the second area.

12. The electroluminescent display device of claim 11, wherein the first trench has a first width and the second trench has a second width, wherein the first width is greater than the second width.

13. The electroluminescent display device of claim 12, wherein the first and second trenches have a closed curve shape.

* * * * *